US007873202B2

(12) United States Patent
Kurihara et al.

(10) Patent No.: US 7,873,202 B2
(45) Date of Patent: Jan. 18, 2011

(54) METHOD AND APPARATUS FOR REVIEWING DEFECTS OF SEMICONDUCTOR DEVICE

(75) Inventors: Masaki Kurihara, Yokohama (JP); Toshifumi Honda, Yokohama (JP); Ryo Nakagaki, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1187 days.

(21) Appl. No.: 11/488,636

(22) Filed: Jul. 19, 2006

(65) Prior Publication Data
US 2007/0031026 A1  Feb. 8, 2007

(30) Foreign Application Priority Data
Aug. 5, 2005  (JP) .............................. 2005-227374

(51) Int. Cl.
*G06K 9/00*  (2006.01)
(52) U.S. Cl. ....................... 382/141; 382/149
(58) Field of Classification Search ........................ None
See application file for complete search history.

(56) References Cited

U.S. PATENT DOCUMENTS 6,091,846 A * 7/2000 Lin et al. ..................... 382/145

| 6,756,589 | B1 * | 6/2004 | Obara et al. ................. 250/306 |
| 6,850,320 | B2 * | 2/2005 | Shibata et al. ........... 356/237.3 |
| 7,065,239 | B2 * | 6/2006 | Maayah et al. .............. 382/145 |
| 2002/0051565 | A1 * | 5/2002 | Hiroi et al. .................. 382/149 |
| 2003/0104288 | A1 * | 6/2003 | Pang ............................. 430/5 |

FOREIGN PATENT DOCUMENTS

| JP | 2000-030652 | 1/2000 |
| JP | 2000-067243 | 3/2000 |
| JP | 2001-325595 | 11/2001 |
| JP | 2003-098114 | 4/2003 |

* cited by examiner

*Primary Examiner*—Samir A. Ahmed
*Assistant Examiner*—John W Lee
(74) *Attorney, Agent, or Firm*—Antonelli, Terry, Stout & Kraus, LLP.

(57) ABSTRACT

An apparatus for reviewing defects of a semiconductor device is provided to review a lot of defects in a short period of time thereby to improve the efficiency of defect review. A method for reviewing defects of a semiconductor device includes obtaining an image including a defect on the semiconductor device detected by a detection device by use of a scanning electron microscope at a first magnification, making a reference image from the image including the defect obtained at the first magnification, detecting the defect by comparing the image including the defect obtained at the first magnification to the reference image made from the image including the defect at the first magnification, and taking an image of the detected defect at a second magnification that is larger than the first magnification.

11 Claims, 14 Drawing Sheets

FIG.6
(a)
(b)
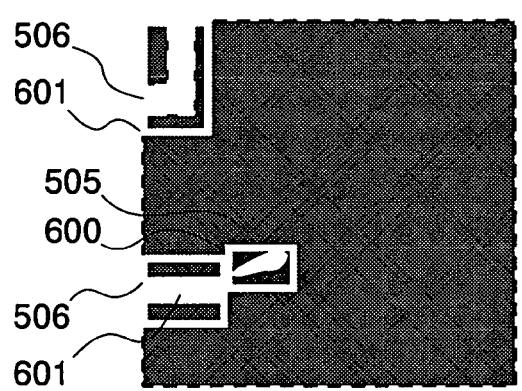
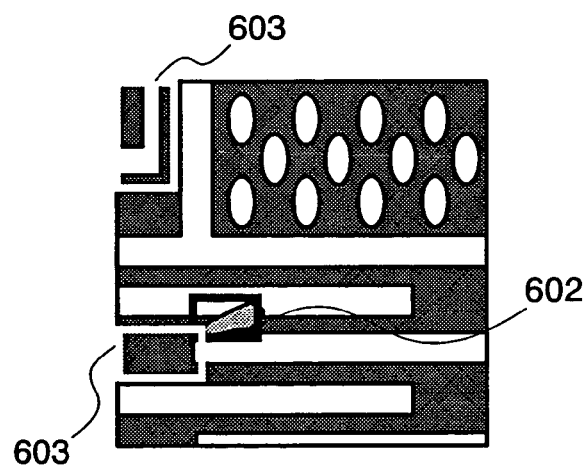

FIG.10
(a)
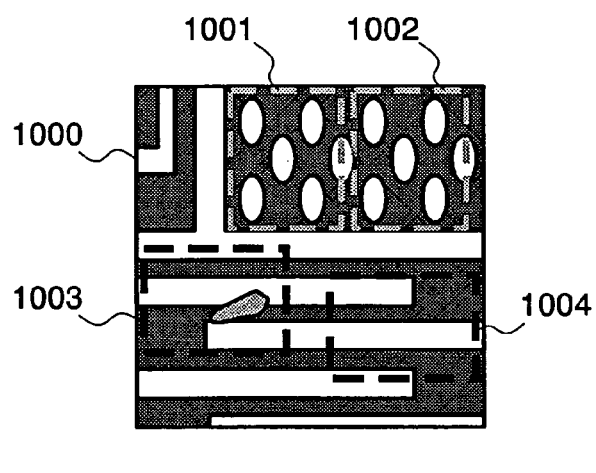
(b)
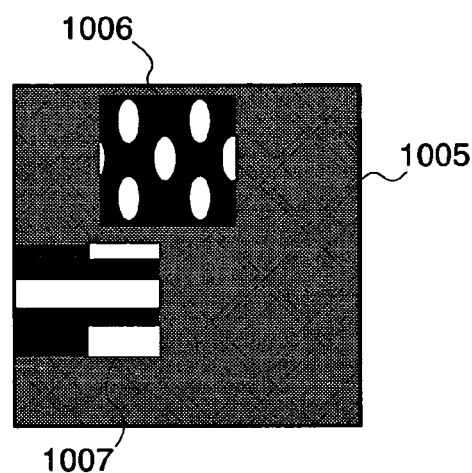
(c)
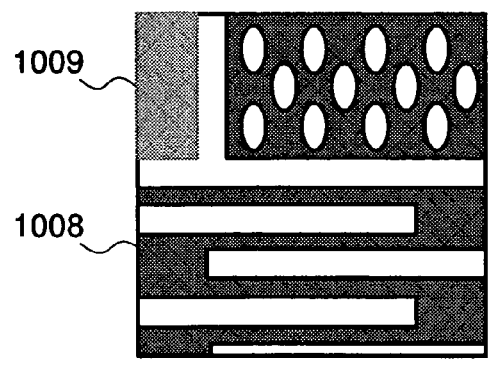
(d)
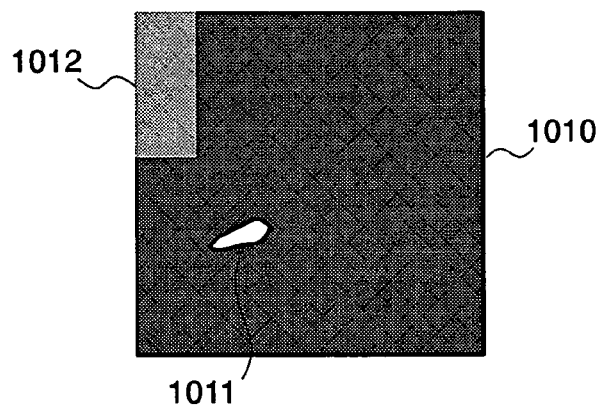

FIG.14
(a)
(b)
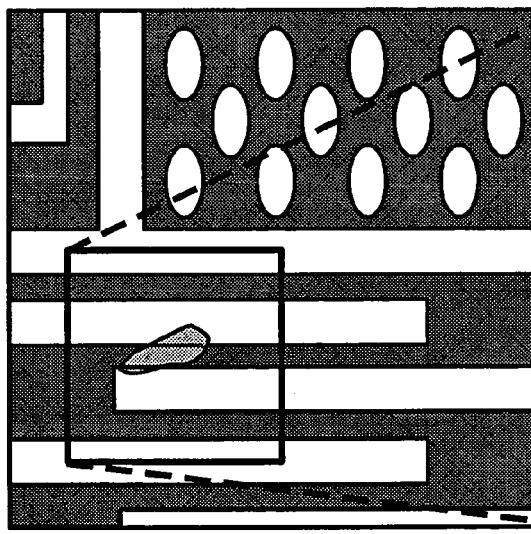
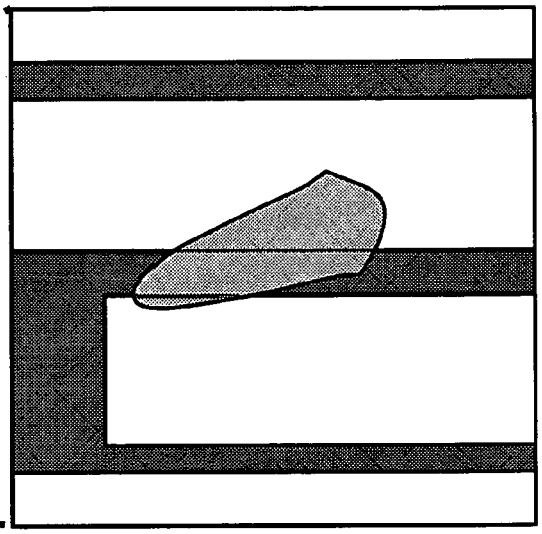

METHOD AND APPARATUS FOR REVIEWING DEFECTS OF SEMICONDUCTOR DEVICE

BACKGROUND OF THE INVENTION

The invention relates to an apparatus for inspecting appearance of a semiconductor device to review defects thereon.

In a manufacturing process of a semiconductor device, in order to ensure a high yield of products, it is necessary to detect and repair various defects occurring in the process at an early stage. This is normally carried out by the following steps.

A semiconductor wafer of interest to be inspected is inspected by a wafer-appearance inspection system, a wafer foreign matter detection system, or the like, to detect the position of a defect occurring on the wafer, or foreign matter attached thereto.

Then, the defect detected is observed (hereinafter referred to as "review"), and classified according to sources. In this review, a device dedicated for defect review, including a microscope, is normally used to observe or review a defective part at high magnification. In some cases, other devices having a reviewing function, for example, an appearance inspection system may be used.

When the number of defects detected by the detection system is very large, the defect review as described above requires much time and effort. Recently, a review apparatus has been increasingly developed which has an automatic defect review (ADR) function of automatically taking images of defects and collecting them. JP-A No. 30652/2000 discloses a review apparatus having the automatic defect review function using a scanning electron microscope in an image pickup system.

FIG. 2 shows a flowchart of an ADR process, which is disclosed in the JP-A No. 30652/2000.

The review apparatus selects one of defects designated, and takes an image of a corresponding part of a chip in a wafer that is adjacent to one chip where the defect part exists, at a first magnification set. This corresponding part has the same pattern as that of the defect part. This image is referred to as a (low-magnification) reference image. The reference image taken is stored in a storage medium (for example, a magnetic disc) in the review apparatus.

Then, a stage is moved such that the position of the defect is located approximately at the center of a visual field of an optical system. Thereafter, an image of the defect part is taken at the first magnification set in the same manner as in taking the reference image. This image is hereinafter referred to as a (low-magnification) defect image.

From the thus-obtained defect image and reference image, the defect part is identified, and then imaged at higher magnification than the first magnification set. This image is hereinafter referred to as a high-magnification defect image. This high-magnification defect image is intended to be used in an automatic defect classification (ADC) at a later stage. The high-magnification defect image is not necessarily essential to identify the defect part, but is needed to the review apparatus for the purpose of reviewing details of the defect.

Identifying the defect part is carried out by a comparison inspection which involves comparing the defect image to the reference image, and extracting a different part between these images as the defect. The comparison inspection can be categorized into two following methods. First, die-to-die comparison involves comparing an image of appearance of a part of one chip to that of another part of a different chip designed to have the same shape on the same wafer. The image of another part serves as a reference image. As the other comparison method, cell-to-cell comparison involves, when the same wiring pattern is periodically designed in, for example, each cell of a memory, comparing an image of appearance of a pattern of one cell to that of a different another cell designed to have the same shape in the same chip and supposed to have the same appearance. The image of appearance of the pattern of the different another cell serves as a reference image.

In recent years, the number of defects to be reviewed which exist on the wafer is increased with increasing diameter of a semiconductor wafer. Since the review apparatus has low throughput as compared to a detection device, it is necessary to speed up the ADR operation which involves taking the defect image and the reference image, and identifying the defect part. Various speed-up methods have been proposed.

Generally, in the ADR, it takes much time to move a stage from an initial point to a destination, and to take the defect and reference images. In order to speed up the ADR, in addition of speeding up these processes, some of these image-taking steps may be omitted, which becomes effective. Normally, the step of taking the reference image may be omitted. For example, a method omitting one step has been proposed which involves previously preparing for the reference image. Alternatively, another omitting method has been proposed which involves synthesizing a reference image from a defect image, and inspecting the defect by comparing these images. The former in the cell-to-cell comparison involves previously storing a periodic pattern as an image for comparison, and comparing this image to the defect image, thereby extracting a defect area, as disclosed in JP-A No. 67243/2000. The latter involves comparing local areas or the like having the similar appearance on the defect image, and calculating the reliability of defect detection in a difference area based on a probability distribution of normal areas, there by determining the difference area with high reliability as the defect, as disclosed in JP-A No. 98114/2003.

JP-A No. 325595/2001 discloses a method for extracting a defect part which involves binarizing a difference image between the defect image and the reference image, thereby extracting the defect part.

SUMMARY OF THE INVENTION

The system as disclosed in the JP-A No. 67243/2000 is applicable only to the cell-to-cell comparison. That is, applications of this system are limited. Previously preparing for the reference image must involve preparing for a lot of images because it is unknown beforehand what sort of defect image is to be taken. Additionally, when there is no corresponding desired reference image among the images prepared, the identification of the defect part is impossible.

In the system as disclosed in the JP-A No. 98114/2003, it is hypothesized that there are, in the wiring pattern, local areas having the same appearance to each other in a corresponding image, whereas there is no area having the same appearance as that of the defect in the defect image. In a step of forming holes in manufacturing the semiconductor device, lots of potential contrast defects (which are defects that appear to differ from other parts in brightness by observation with a secondary electron image because the potential of a wiring hole is different from that of the other parts) with the same appearance may occur. This system results in a decrease in reliability of the detection. Although means for confirming whether the detected defect is a real one or not is needed, the above-mentioned system fails to contemplate the means. Furthermore, in this system, the larger the image size, the more the amount of calculation. This makes it impossible to detect defects during a real-time run.

The invention is directed to an apparatus for reviewing defects of a semiconductor wafer with high throughput.

That is, in one aspect of the invention, a method for reviewing defects of a semiconductor device includes the steps of obtaining an image including a defect on the semiconductor device detected by a detection device using a scanning electron microscope at a first magnification, and making a reference image from the image including the defect obtained at the first magnification. The method also includes the steps of detecting the defect by comparing the image including the defect obtained at the first magnification to the reference image made from the image including the defect at the first magnification, and taking an image of the detected defect at a second magnification that is larger than the first magnification.

According to the invention, the step of taking the reference image of low magnification can be omitted by synthesizing the reference image from the defect image in detection of the defect, resulting in effective review of the defect. It is determined whether the detection of defects is possible or not based on the reference image synthesized from the defect image. This can prevent erroneous detection of parts other than the defects, enabling the automatic defect review with high detectivity.

Furthermore, according to the invention, the step of taking the reference image can be omitted, which allows for the automatic defect review with the high throughput.

These and other objects, features and advantages of the invention will be apparent from the following more particular description of preferred embodiments of the invention, as illustrated in the accompanying drawings.

BRIEF DESCRIPTION OF THE DRAWINGS

FIG. 6A is a diagram for explaining determination of a defect among the suspected defects according to the first embodiment, and showing a state in which a rectangular area 600 including the suspected defects is set;

FIG. 6B shows a rectangular area 602 on the defect image;

FIG. 10A is a diagram showing a state in which the defect image is divided into local areas;

FIG. 10B is a diagram showing a state in which images of the divided local areas are incorporated into the reference image;

FIG. 10C is a diagram showing a synthesized reference image;

FIG. 10D is a diagram showing a state in which unidentified area is set in the synthesized reference image;

FIG. 14A shows a defect image of low magnification for explaining a way to cut out an image part to be reviewed from the defect image according to the fourth embodiment; and FIG. 14B shows a defect image of high magnification which is manufactured by being cut from the defect image of low magnification.

DESCRIPTION OF THE PREFERRED EMBODIMENTS

Reference will now be made to preferred embodiments of the invention, which are illustrated in the accompanying drawings.

First Preferred Embodiment

Figure 1:
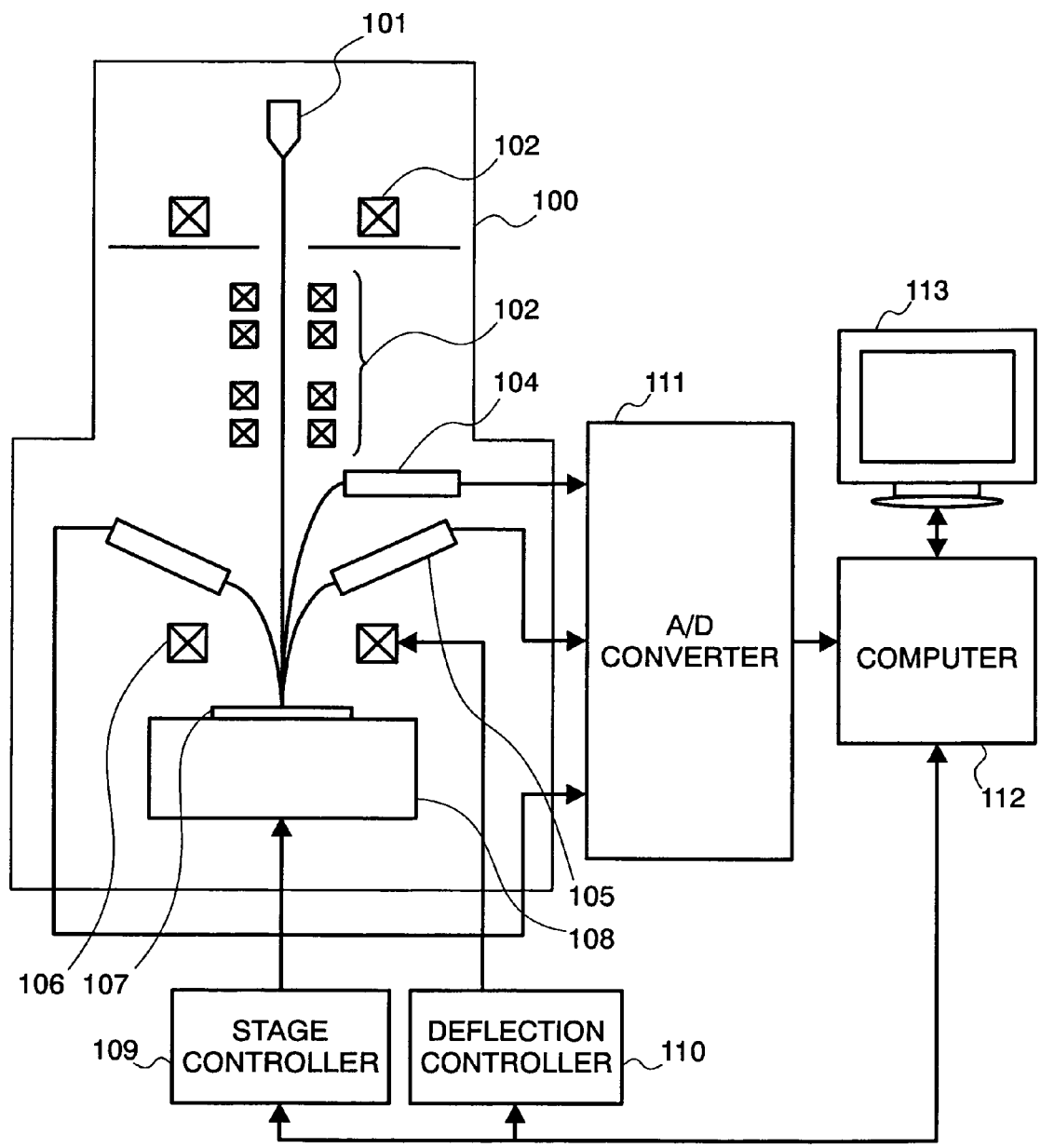
FIG. 1 is a diagram showing a configuration of a review apparatus using a scanning electron microscope.
Figure 2:
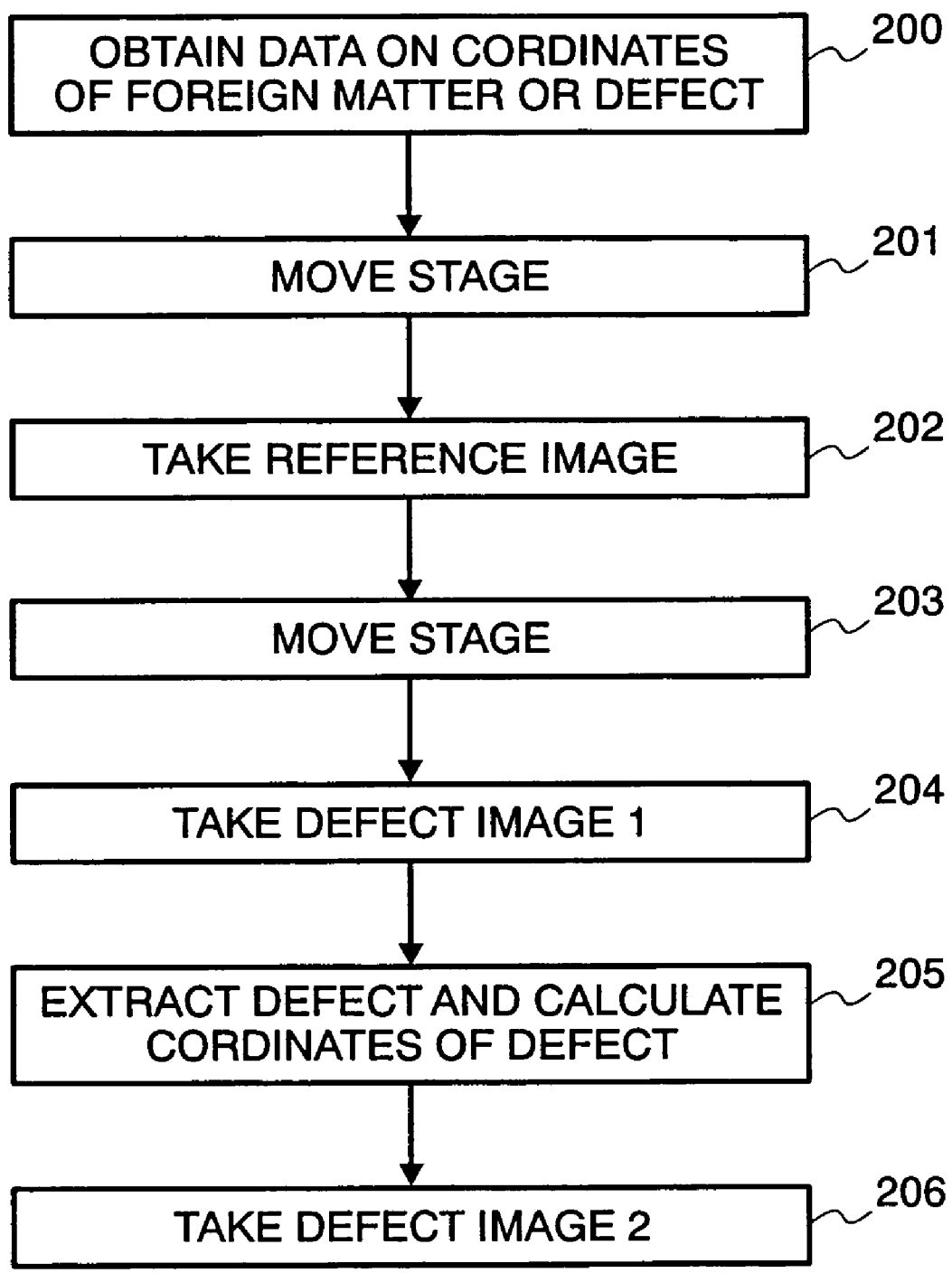
FIG. 2 is a flowchart showing a conventional procedure for detecting defects.

FIG. 1 shows a schematic diagram of a configuration of a review apparatus using a scanning electron microscope (SEM) for analyzing defects occurring in a semiconductor wafer according to a first preferred embodiment of the invention. An electron optical system of SEM is accommodated in a vacuum chamber 100. Electrons emitted from an electron gun 101 are converged by a focusing lens 102, and directed to an irradiation position by a deflection and scanning coil 103. The electrons then come into a focus on a semiconductor wafer 107 by an objective lens 106 controlled by a deflection controller 110. The irradiation position is moved by an XY stage 108, which is controlled by a stage controller 109. Secondary reflected electrons are emitted from the semiconductor wafer 107, which has been irradiated with the electrons, and detected by detectors 104 and 105 for detecting the secondary electrons and/or reflected electrons. Information on a signal detected is converted from an analog value into a digital value by an A/D converter 111, and then fed to a computer 112 for image processing. This computer displays an image taken or the like together with a display device 113 for display.

Figure 3:
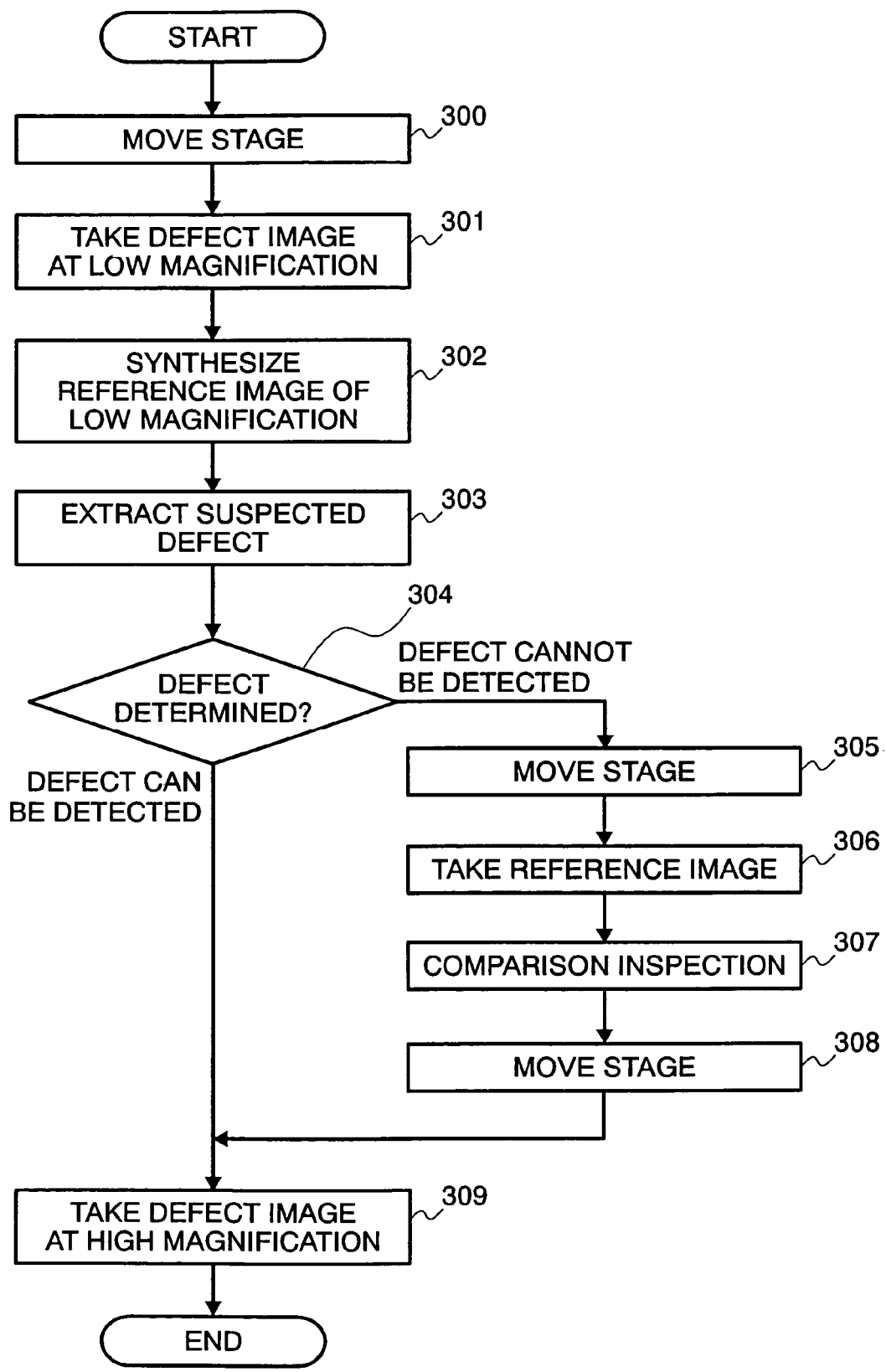
FIG. 3 is a flowchart showing a procedure for detecting defects according to a first preferred embodiment of the invention.

FIG. 3 shows a flowchart of a procedure for taking an image of the semiconductor wafer and detecting defects by the review apparatus. First, in order for the review apparatus to take an image of a defect on a semiconductor wafer at relatively high magnification, which defect has already been detected by a detection device not shown at relatively low magnification, a stage is moved to a position of coordinates of the defect based on information on the coordinates of a defect position detected by the detection device (step 300). When the stage 108 is moved to the destination, an image of appearance of the semiconductor wafer is taken by the SEM (step 3301). At this time, the coordinate accuracy of the review apparatus is not necessarily identical to that of the detection device. For this reason, even if the stage 108 is controlled to observe the wafer by the review apparatus based on the information about the coordinates of the defect output from the detection device, the defect to be reviewed is not always within a visual field of the SEM. Thus, when the defect is reviewed by the review apparatus based on the information about the coordinates of the defect position provided by the detection device, it is necessary to take the image by enlarging an image visual field of the SEM of the review apparatus at low magnification such that the defect to be reviewed surely exists within the visual field.

Figure 4:
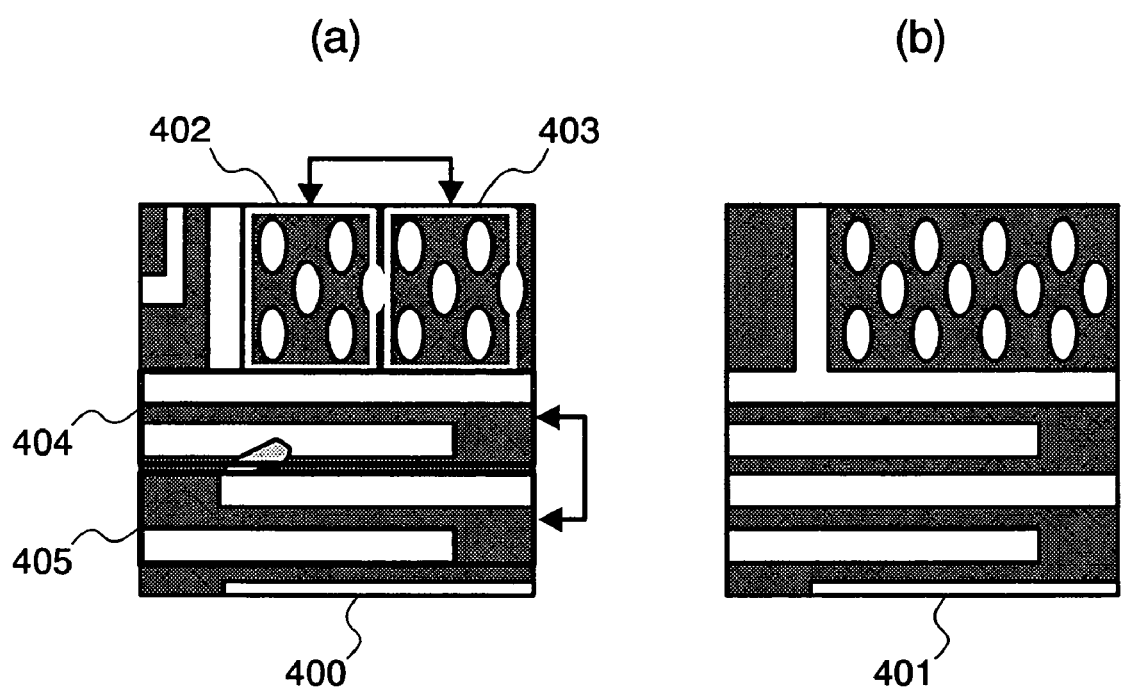
FIG. 4A shows a defect image.
FIG. 4B shows a synthesized reference image.

Conventionally, in order to detect a defect from a defect image taken, an image of a part without any defects on a semiconductor wafer is taken as a reference image, and the defect image is compared to the reference image by comparison inspection. In the present invention, in order to decrease the number of imaging and moving the stage, and to improve the throughput, first, only the defect image is used to detect the defect without using the reference image. Thus, in the invention, an image serving as the reference image, which would be obtained by taking an image of the part without any defects in the prior art, is made by removing a defect part from the defect image (302). This image is hereinafter referred to as a synthesized reference image. For example, in order to make the synthesized reference image, since most of wiring patterns formed on semiconductor wafers have periodicity, a pixel of interest to be synthesized may be replaced with another pixel apart from the pixel of interest by one period on the wiring pattern. For example, in a defect image (400) as shown in FIG. 4A, template matching is done using templates (402, 404) in the lateral and longitudinal directions, respectively, to take matching patterns (403, 405), with which the entire defect image is replaced. Note that if a pixel is replaced simply, the defect is shifted by one period, which leads to detection of a virtual image of the defect. Thus, the selection of pixel is based on calculation and judgment of existing probability of brightness of the pixel at a target position from brightness of surrounding pixels. In this way, a synthesized reference image (401) is obtained as shown in FIG. 4B. Alternatively, as disclosed in the JP-A No. 98114/2003, the appearance of the wiring pattern of a good product or wafer may be combined with the reference image taken or picked up, thereby forming the synthesized reference image (401).

Then, a difference between the defect image and the synthesized reference image is determined, and the difference value is binarized, thereby extracting suspected areas to be regarded as defects from the defect image (step 303). This series of procedure is performed using, for example, a method disclosed in the JP-A No. 30652/2000.

It is determined whether or not the defect can be detected using only one defect image (step 304). If yes, that is, if the defect can be detected, the defect detection will end. If not, that is, if the defect cannot be detected, a stage is moved to a position of a good product (when an object of interest to be inspected has a repetitive pattern, to a position of an adjacent pattern, alternatively, in a nonrepetitive pattern, to a position of a corresponding pattern of an adjacent chip (die)) (step 305), and another reference image is taken (step 306). Comparison inspection between the defect image and the reference image (step 307) makes a difference image to detect the defect. At this time, the visual field of the electron optical system is located in a position where the reference image has been taken. Then, the stage is moved to the defect position (step 308), thereby taking another defect image at high magnification. If the defect can be detected with only one piece of defect image, the defect image is taken at the high magnification without moving the stage (step 309).

Figure 5:
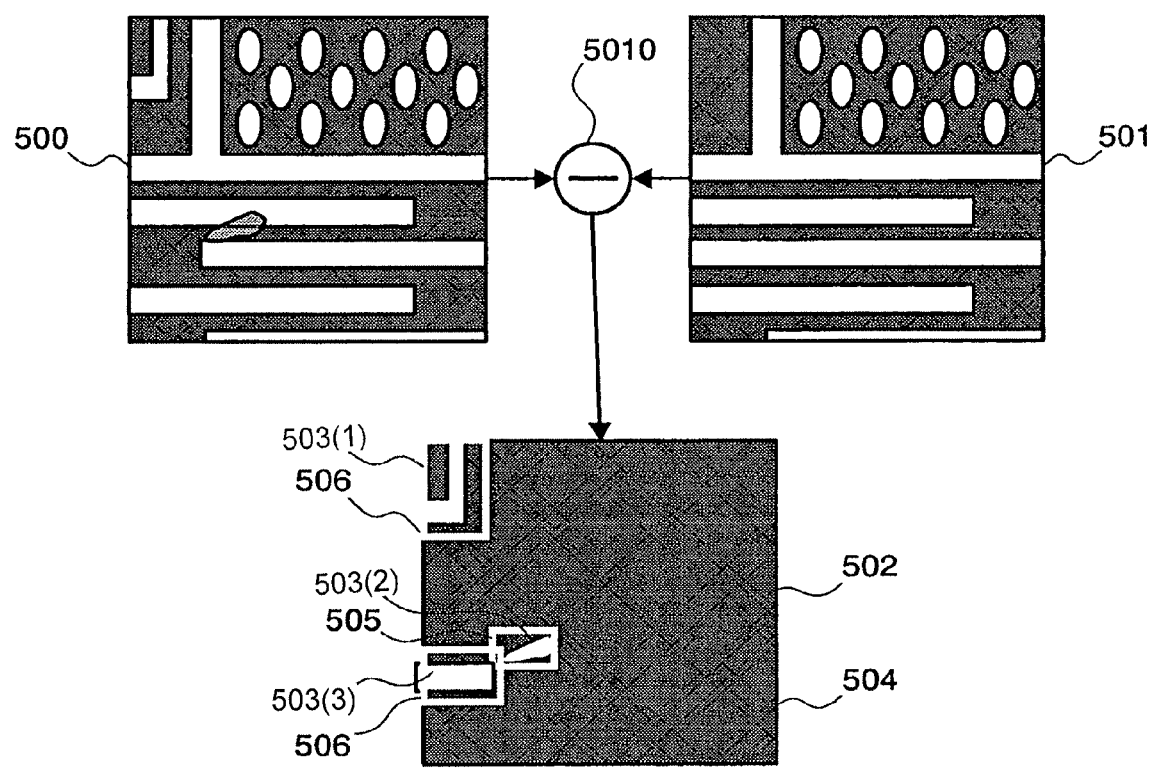
FIG. 5 shows a procedure for extracting suspected defects according to the first embodiment of the invention.

The step of detection of the suspected defects (step 303) will be described in detail with reference to FIG. 5. In the step of detection of the suspected defects (step 303), first, a difference (5010) between the defect image 500(400) and the synthesized reference image 501 (401) is determined. The determination of the difference, which corresponds to a different part between two images, is represented by a difference value. This difference value is binarized to make a difference image 502. This difference image 502 can be divided into the suspected defects 503(1), 503(2), 503(3), and other area 504. In an example shown in FIG. 5, among the suspected defects 503(1), 503(2), and 503(3), the defect 503(2) is a real one, and the wiring patterns 503(1) and 503(3) are not defects. Thus, since the difference image 502 obtained by determining the difference between the defect image 500 (400) and the synthesized reference image 501 (401) may include an extracted area which is not a real defect area, it is necessary to discriminate the real defect from the other suspected defects. This discrimination is made in the step of the defect determination (step 304).

Referring to FIG. 6, the step of the defect determination (step 304) will be described in detail. A rectangular area 600 surrounding the suspected defect 503(2) is set, and a rectangular area 602 corresponding thereto on the defect image is paid attention to. The rectangular area 602 represents the different part between the defect image 500 (400) and the synthesized reference image 501 (401). This part is suspected as the defect. Whether this different part is a real defect part or not needs an evaluation reflecting the difference of the rectangular area 602 from the area 600 in appearance. This evaluation can desirably be extracted as a value from the image (hereinafter referred to as a feature amount) so as to maintain objectivity. The defect part, the wiring pattern, and a primary coating or base have differences in appearance (light brightness, shaded image, color, etc.), and thus are classified based on the feature amount, such as a height of the rectangular area obtained from the shaded image, surface asperities thereof, or the like.

Figure 7:
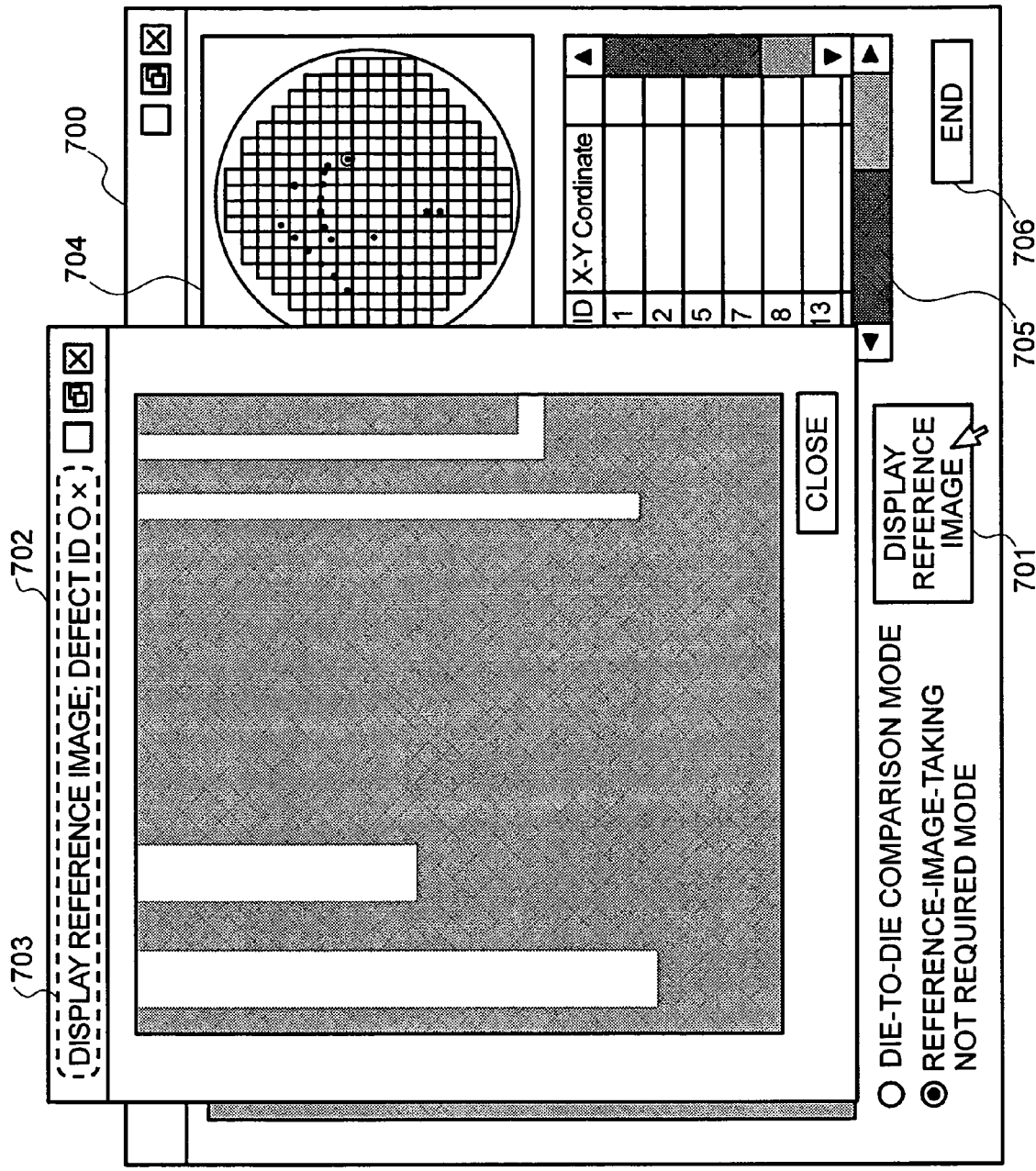
FIG. 7 is a diagram showing a GUI display in a defect detection mode which does not require taking the reference image according to the embodiment.
Figure 8:
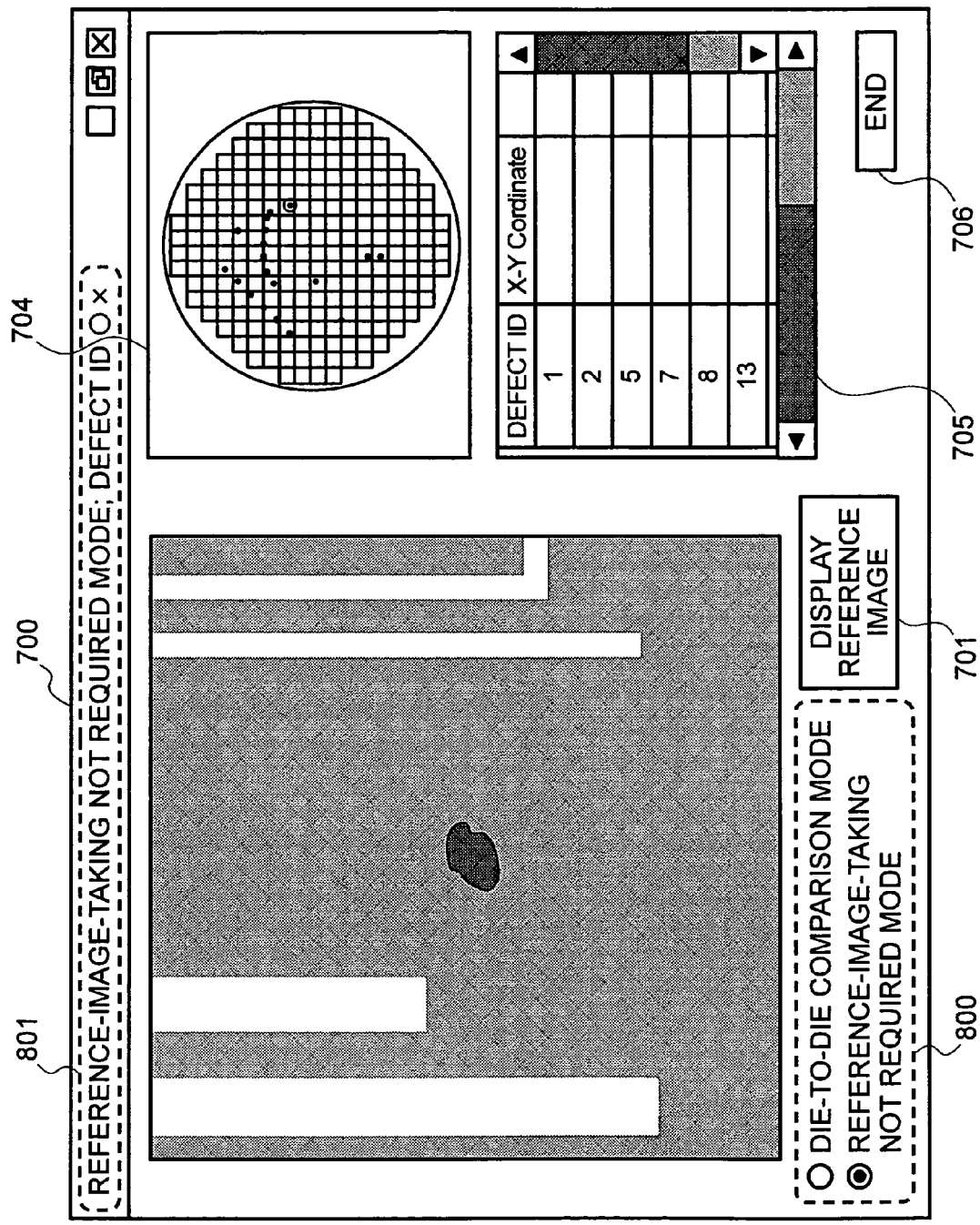
FIG. 8 is a diagram showing a GUI display in a defect detection mode which does not require taking the reference image according to the embodiment.

In the embodiment, in actual use, it is necessary to sequentially review the state of defect detection by the present system, and to provide users of the review apparatus with means for changing a processing mode. For this reason, the means for sequentially reviewing includes a GUI display 700 for indicating a process of synthesizing the reference image, as shown in FIG. 7. Pushing down on a reference image display button 701 disposed on the GUI display causes the image and a defect ID 703 to be displayed in another window 702. Alternatively, they may be displayed not in another window, but in parallel with the defect image. This allows the user to review the reference image and adjust parameters for synthesizing the reference image. The GUI display 700 may include a selectable wafer map 704 for indicating the position of existence of the defect, a selectable table 705 for storing therein the defect ID and the coordinates of the defect position on the wafer, and an end button 706 for performing an end process. The means for changing the processing mode may be a mode switching button 800 disposed in the GUI as shown in FIG. 8. The user judges and performs the mode switching based on the reviewing of the reference image indicated by the GUI display 700, prior information of the semiconductor wafer of interest for the user, or the like. At this time, a display part 801 for clearly indicating an execution mode to the user, in addition to the switching button, may be provided. The display part 801 indicates a mode of not requiring taking the reference image, that is, a mode in which the reference image is synthesized to detect the defect.

Second Preferred Embodiment

Now, a review system with the same hardware configuration as that of the first preferred embodiment will be described in detail.

This embodiment may include a process in which information on a suspected defect extracted based on the comparison between a first synthesized reference image and a defect image is used to improve the first synthesized reference image so as to synthesize a new reference image of interest. The processing is carried out recursively, thereby permitting the high-accuracy defect detection as compared to the first embodiment. In addition, before the improving process of the synthesized reference image, determination of defect detection may be carried out, which can omit a redundant process.

Figure 9:
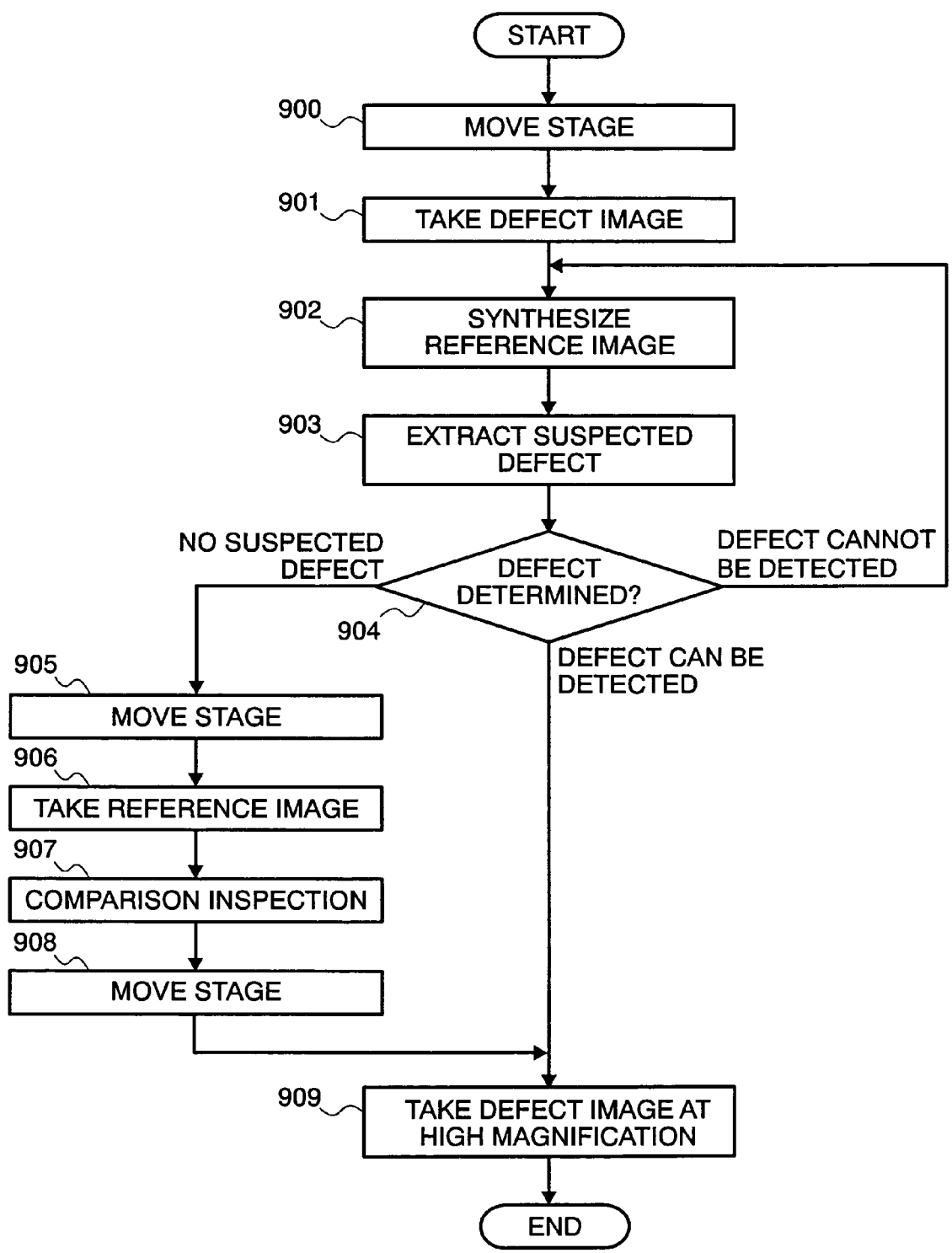
FIG. 9 is a flowchart of defect detection by a review apparatus according to a second preferred embodiment of the invention.

The processing flow according to the embodiment will be explained below with reference to a flowchart of FIG. 9. First, the stage is moved to a position of coordinates of a defect output from the detection device (step 900). In the target position, an image of appearance of the semiconductor wafer is taken (step 901). At this time, it is necessary to take the image at low magnification such that the defect is within an image visual field, as explained in the first embodiment.

Then, an image corresponding to a reference image, which would be conventionally obtained by taking a good product, is made from the defect image (step 902). This image is hereinafter referred to as the synthesized reference image. A method for making the synthesized reference image may be one described in the first embodiment, or in the JP-A No. 98114/2002.

In order to identify or specify a defect part, the defect image is compared to the synthesized reference image, thereby extracting the different part (step 903). The extracted part may include not only the defect but also the wiring pattern or the like, all of which are hereinafter referred to as suspected defects.

In order to identify only the defect from the suspected defects, it is determined whether or not each suspected defect is a real defect (step 904). At this time, when the defect is identified, an image of the defect is taken in the position at higher magnification (step 909). If it cannot be determined definitely whether all suspected defects extracted are real defects or not, then it is judged that the defect detection is impossible, and the operation returns to the step of synthesizing another reference image (step 902), thereby to produce another synthesized reference image which is more appropriate. In contrast, when the suspected defects are not able to be extracted, it is judged that no defects exist, or the defect cannot be identified by comparison with the synthesized reference image. Thus, the stage is moved to a good product having the same wiring pattern as the defect part (step 905), where the good product is imaged to obtain another reference image (step 906). Then, the defect image is compared with the reference image (step 907) to extract the different part as the defect. Then, the stage is moved from the good product to the defect part (step 908), and a defect image is taken at high magnification (step 909).

Now, the synthesis of the reference image (step 902), the extraction of the suspected defects (step 903), and the determination of the defect (step 904) will be described in detail with reference to FIG. 10A to 10D. First, as shown in FIG. 10A, a defect image (1000) is divided into local areas. Among these local areas, templates (1001, 1003) are set to do the matching. Matched patterns (1002, 1004) are incorporated into a reference image (1005) shown in FIG. 10B (1006, 1007). This process is repeated to form a new synthesized reference image (1008) shown in FIG. 10C, in which an unavailable area (1009) exists. Note that in a method as disclosed in the JP-A No. 98114/2003, a part not matched may be regarded as a defect, which may lead to erroneous detection. In contrast, in the invention, as shown in FIG. 10D, this area (1009) in comparing between the defect image and the synthesized reference image is registered as an unidentified area (1012) in which the defect determination is not carried out. A defect (1011) detected in any positions other than this area is extracted as the suspected defect.

The above-mentioned matching process takes much time. For this reason, the sequent determination is carried out in the step of defect determination (step 904) in the processing flowchart shown in FIG. 9. Once the defect is detected, the matching process will not be carried out in the following steps, thereby achieving speeding up the process of identifying the defect. Alternatively, based on a statistic representing the probability of defect, the feature amount (such as surface asperities, or a height), or the like, a defect detectable area by only the defect image, and an undetectable area may be set on the defect image taken, and the defect detectable area may be subjected to the matching processing, thereby speeding up identifying the defect. At this time, information about the defect detectable area and the defect undetectable area can be held, and used in an ADS, which is disposed at the later stage of the ADR.

This embodiment also has the same kind GUI display as that shown in FIGS. 7 and 8, which has been explained in the first embodiment.

Third Preferred Embodiment

Now, in a third preferred embodiment of the invention, a review system with the same hardware configuration as that of the first preferred embodiment will be described in detail.

This embodiment differs from the first and second embodiments in that a focus AF (Auto Focus) process of the SEM, which will be required for taking another defect image at a second magnification higher than the first magnification, is performed during the defect detection process using one piece of the defect image taken at the first magnification. This allows for the defect detection without taking the time for the AF processing into consideration.

Figure 11:
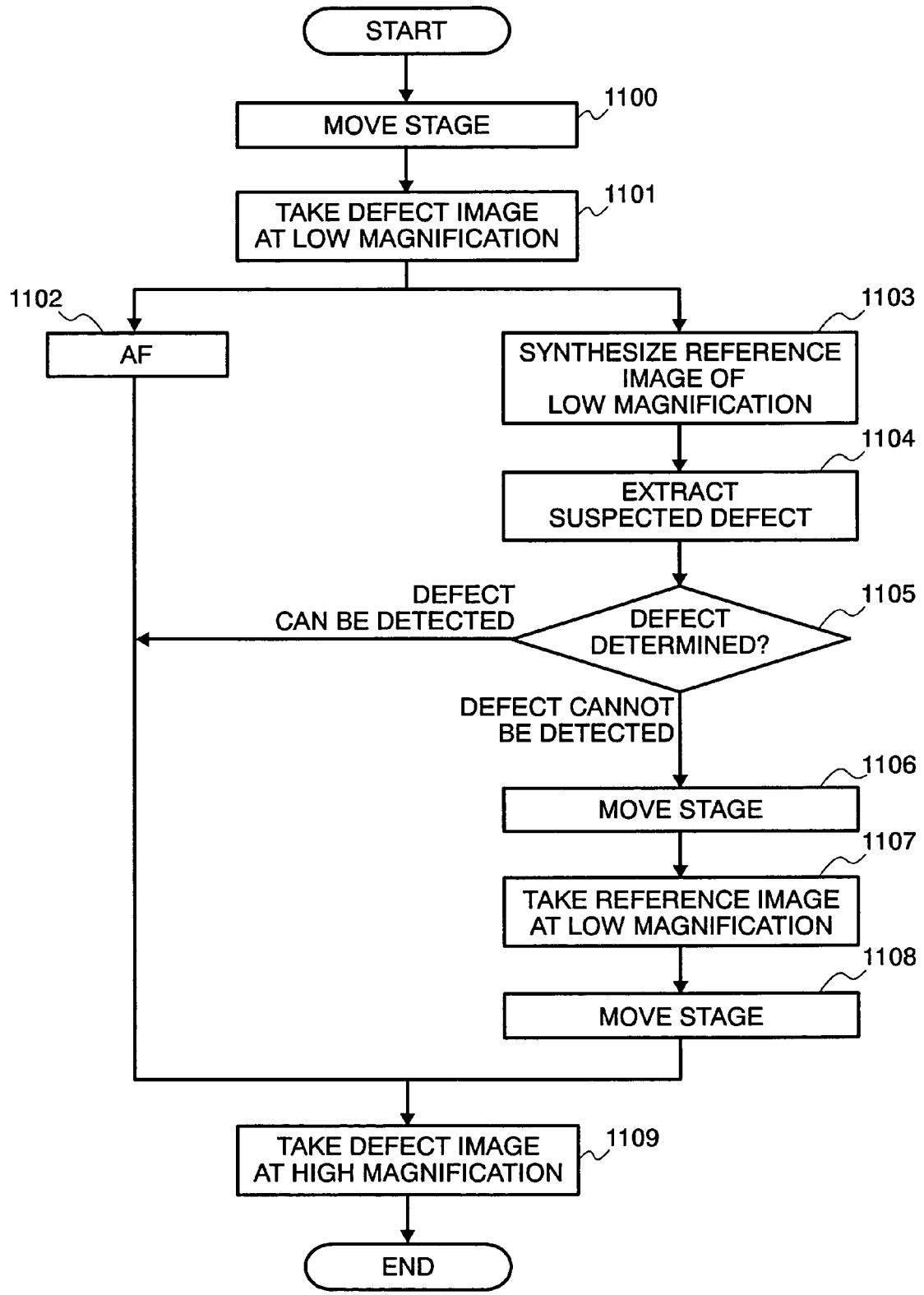
FIG. 11 is a flowchart of defect detection by a review apparatus according to a third preferred embodiment of the invention.

FIG. 11 is a processing flowchart obtained when the present embodiment is applied to an ADR processing flow.

First, a stage is moved to a position of coordinates of the defect detected by the detection device not shown (step 1100). At this time, in the target position, an image of appearance of a semiconductor wafer (defect image) is taken (step 1101). A reference image is synthesized from the defect image taken (step 1103). Thereafter, based on the defect image and the synthesized reference image, the defect detection process is performed using the image at low magnification (step 1104). During the low-magnification reference image synthesizing process (step 1103), and the defect detection process (step 1104), under a condition in which another image of high magnification is to be taken, the focus position of an electron beam of the SEM is moved forward and backward to obtain a plurality of images, thereby determining the focus position appropriate for obtaining the high-magnification image.

The defect detection process using the low-magnification image as shown in the flowchart is carried out in tandem with the auto focus AF (Auto Focus) process (step 1102) for setting the focus position that will be appropriate when the high-magnification image determined by the above-mentioned process is obtained. At this time, the AF process is a hardware process of the electron optical system, while the defect detection is a software process which is performed by a work station. Thus, the AF process time generally tends to become long. In contrast, the above-mentioned processing flow has an advantage in that the estimated ADR process time does not depend on the time required for the defect detection.

Thereafter, it is determined whether the defect detection is possible or not in the same way as the first embodiment (step 1105). At this time, if the defect detection is possible, a defect image is taken at high magnification as it is (step 1109). If not, the stage is moved to an imaging position for a reference image (step 1006), a low-magnification reference image is taken (step 1107). Then, the stage is moved to the defect position (1108) thereby to take the defect image at high magnification (step 1109).

Although in the processing flow shown in FIG. 11, the focus position of the electron beam of the SEM is moved forward and backward to obtain a plurality of images on a condition where the high-magnification image is to be obtained after taking the low-magnification image, the invention is not limited thereto. Alternatively, on a condition where the high-magnification image is to be obtained before taking the low-magnification defect image after the stage is moved, the focus position of the electron beam of the SEM may be moved forward and backward to obtain a plurality of images. In this case, a process for determining the real focus position by processing a plurality of images obtained by moving the focus positions may be carried out from the step of taking the low-magnification defect image (step 1101) to the step of extracting the suspected defects (step 1104).

Figure 12:
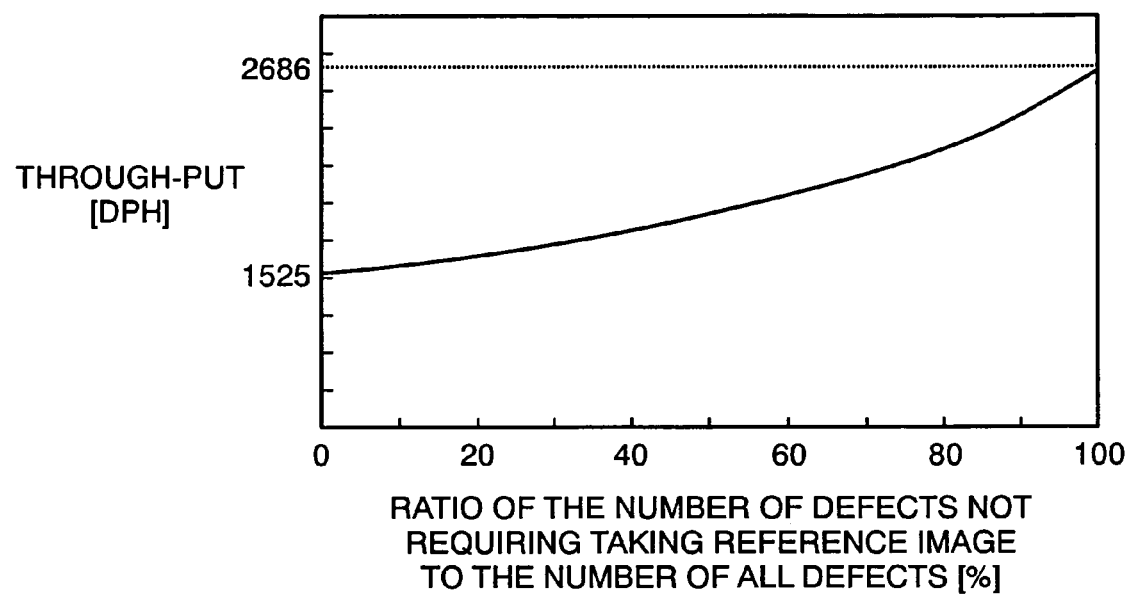
FIG. 12 shows throughput according to the third preferred embodiment.

For example, a processing time of each step is defined as follows. The time for moving the stage is set to 350 ms, the time for taking an image of one frame to 20 ms, the number of accumulated frames of the image taken to 16, and the time for auto focus before taking the high-magnification image to 350 ms. Based on these process times, when the defect detection can be carried out by only the defect image, the total process time is 1.34 s. In contrast, when the above defect detection is impossible, and the reference image needs to be taken, the total process time is 2.36 s. The number of reviewable defects per hour (throughput) are 2686 DPH (Defect Per Hour: the number of reviewed defects/hour) and 1525 DPH in the respective cases. Consequently, when the reference image is taken, the process time is increased by about one second. Thus, the less the ratio of the number of defects not requiring taking the reference image to the number of all defects, the less the throughput, as shown in FIG. 12. This permits the user to switch between the processing modes only by referring to this throughput index.

This embodiment also has the same kind GUI display as that shown in FIGS. 7 and 8, which has been explained in the first embodiment.

Fourth Preferred Embodiment

Now, in a fourth preferred embodiment of the invention, a review system with the same hardware configuration as that of the first preferred embodiment will be described in detail.

This embodiment differs from the embodiments 1, 2, and 3 in that only the defect image is taken at the first magnification.

This can omit not only taking the reference image, but also taking the defect image at the second magnification, resulting in a large decrease in the process time as compared with the other embodiments.

Figure 13:
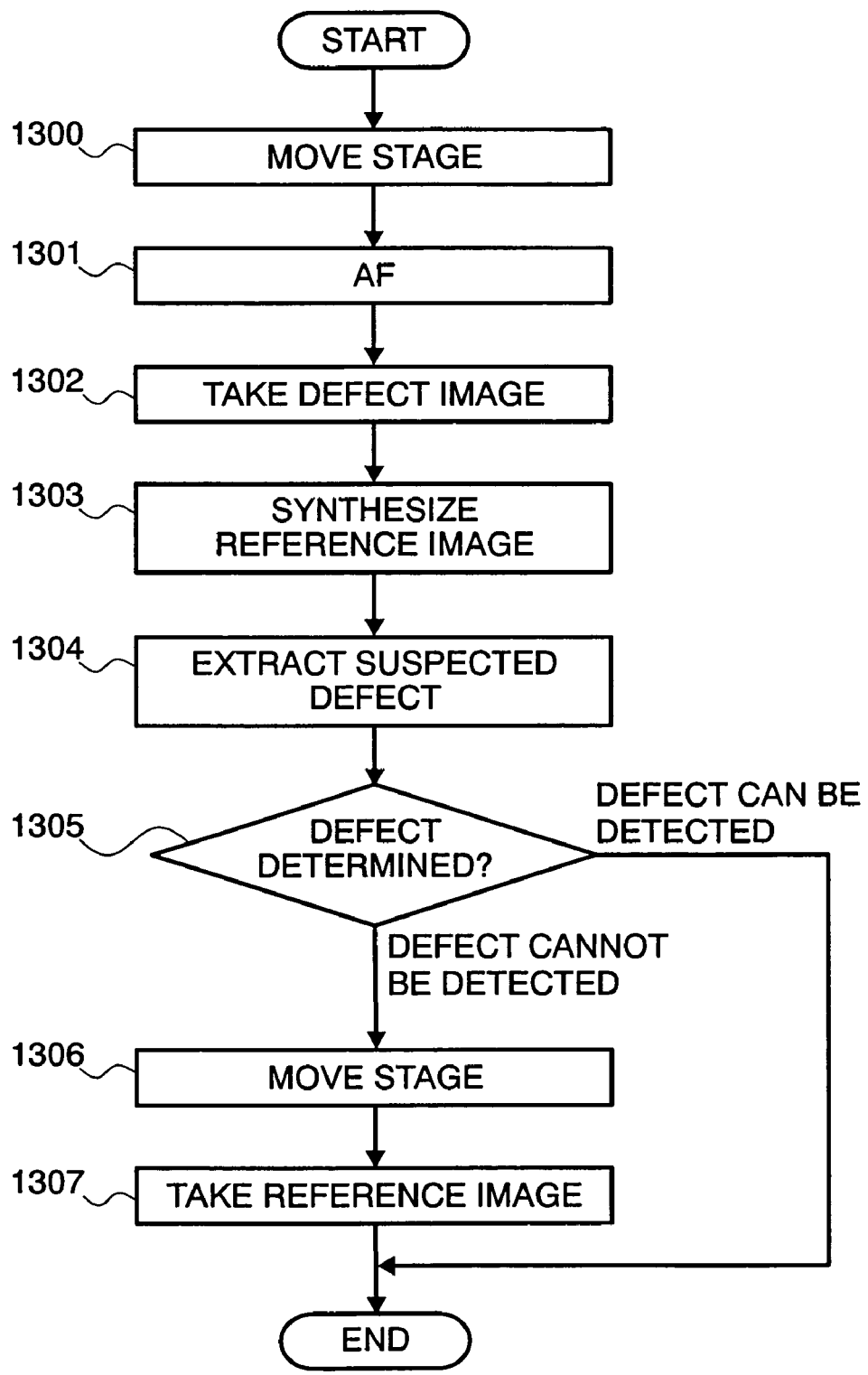
FIG. 13 is a flowchart of defect detection by a review apparatus according to a fourth preferred embodiment of the invention.

FIG. 13 is a processing flowchart obtained when the present embodiment is applied to an ADR processing flow other than that of the second preferred embodiment. First, the stage is moved to the position of coordinates of the defect output by the detection device (step 1300). According to this processing flow, the high-magnification defect image is not taken. Alternatively, in the present embodiment, as shown in FIG. 14A, a low-magnification defect image with high resolution may be taken in a wide visual field, and as shown in FIG. 14B, a part cut from the image may be substituted for an image corresponding to the high-magnification defect image.

In taking the defect image, the image needs to come into focus. Thus, the AF process is needed before taking the defect image (step 1301). Then, the defect image is taken (step 1302). The image taken at this time is magnified by three or four times as compared to the image conventionally taken. When the defect detection is possible only by the defect image, since the necessity of taking the high-magnification defect image is eliminated, the time for taking the high-magnification image can be omitted. Even when the reference image needs to be taken, the number of moving the stage can be decreased by one as compared to the above-mentioned processing flow. In contrast, the time for taking the image might be nine to sixteen times as long as that in the conventional case because the area taken is enlarged. Factors defining the time for taking the image are the area whose image is taken, a speed at which an electron beam is scanned, and the number of accumulated frames. In the defect detection according to the embodiment, since the defect image needs to be an image with high S/N ratio, the accumulated number of frames cannot be decreased. Thus, the scanning speed of the electron beam is increased while keeping the S/N ratio, which requires that the current value of the electron beam is set to a higher value than that of the conventional case. At this time, the current value set is rendered ten times higher than that of the conventional case, which results in an increase of the amount of secondary electrons detected per unit time. This can double the scanning speed. Thus, actually, the time for taking the image becomes one ninth of that of the above-mentioned theory, and becomes equal to that of the conventional case.

Not taking the high-magnification defect image decreases the number of taking the image by one when the defect detection is available without the reference image, compared with the second embodiment. Even if the reference image is taken, the number of moving the stage from the reference point to the defect position is further decreased by one. Therefore, the decrease in throughput is reduced as compared with the case shown in the graph of FIG. 12, which illustrates the ratio of the number of defects not requiring taking the reference image to the number of all defects, and the throughput in the second embodiment.

The later processing involves performing the defect detection process (step 1304) based on the defect image and the reference image, and ending the defect detection process if the defect detection is determined to be possible in a step of determining the possibility of the defect detection (step 1305) in the same manner as the first embodiment. If impossible, the stage is moved to the imaging position of the reference image (1306), and a reference image is taken (step 1307).

This embodiment also has the same kind GUI display as that shown in FIGS. 7 and 8, which has been explained in the first embodiment.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method for reviewing defects of a semiconductor device, the method comprising:
    obtaining an image including a defect on the semiconductor device detected by a detection device using a scanning electron microscope at a first magnification;
    making a reference image from the image including the defect obtained at the first magnification;
    detecting the defect by comparing the image including the defect obtained at the first magnification with the reference image made from the image including the defect at the first magnification; and taking an image of the detected defect at a second magnification that is larger than the first magnification, wherein, when the defect cannot be detected by comparing the image including the defect obtained at the first magnification with the reference image made from the image including the defect obtained at the first magnification, another reference image without any defects is taken using the scanning electron microscope at the first magnification, and then the another reference image taken at the first magnification is compared with the image including the defect obtained at the first magnification, thereby detecting the defect.

2. The method according to claim 1, wherein the reference image made from the image including the defect obtained at the first magnification is an image without any defects.

3. The according to claim 1, wherein, during detecting the defect by comparison with the image including the defect obtained at the first magnification, an uninspected area where detection of a defect is not performed is set in the reference image made from the image including the defect obtained at the first magnification.

4. The method according to claim 1, wherein, during making the reference image from the image including the defect obtained at the first magnification, and detecting the defect by comparing the image including the defect obtained at the first magnification to the reference image made from said image including the defect at the first magnification, a focus condition of said scanning electron microscope for imaging at the second magnification is determined.

5. An apparatus for reviewing defects of a semiconductor device, comprising:

scanning electron microscopic means for obtaining a secondary electron image of a defect on the semiconductor device detected by a detection device;

reference image making means for making a reference image from the image including the defect on the semiconductor device obtained at a first magnification using said scanning electron microscopic means;

defect detection means for detecting the defect by comparing the image including the defect on the semiconductor device obtained at the first magnification using said scanning electron microscopic means to the reference image made by said reference image making means; and control means for controlling said scanning electron microscopic means to take an image of the defect detected by the defect detection means at a second magnification that is larger than the first magnification, wherein, when the defect cannot be detected by comparing the image including the defect obtained at the first magnification by said defect detection means to the reference image made from the image including the defect obtained at the first magnification, said control means controls said scanning electron microscopic means to obtain the reference image without any defects at the first magnification, and controls said defect detection means to detect the defect by comparing the image including the defect obtained at the first magnification by said defect detection means to the reference image without any defects obtained at the first magnification.

6. The apparatus according to claim 5, wherein said reference image making means makes an image without any defects from the image including the defect obtained at the first magnification, as the reference image.

7. The apparatus according to claim 5, wherein, during detecting the defect by comparison with the image including the defect obtained at the first magnification, said reference image making means makes an image as the reference image in which an uninspected area where detection of a defect is not performed is set.

8. The apparatus according to claim 5, further comprising auto focus means, wherein, while said reference image making means makes the reference image and said defect detection means compares the image including the defect obtained at the first magnification by said defect detection means to the reference image made from the image including the defect obtained at the first magnification, thereby detecting the defect, said auto focus means is adapted to determine a focus condition of said scanning electron microscopic means for imaging at the second magnification.

9. The method for reviewing defects of a semiconductor device according to claim 1, wherein, during making the reference image from the image and detecting the defect, a focus condition of said scanning electron microscope for imaging at the second magnification is determined.

10. The method for reviewing defects of a semiconductor device according to claim 1, wherein, during making the reference image, the reference image made from the image including the defect at the first magnification is displayed on a display.

11. The apparatus for reviewing defects of a semiconductor device according to claim 5, further comprising auto focus means, wherein, while said reference image making means makes the reference image and said defect detection means detects the defect, said auto focus means is adapted to determine a focus condition of said scanning electron microscopic means for imaging at the second magnification.

* * * * *